United States Patent
Miller et al.

(10) Patent No.: US 7,820,533 B2
(45) Date of Patent: Oct. 26, 2010

(54) MULTI-STEP PLASMA DOPING WITH IMPROVED DOSE CONTROL

(75) Inventors: Timothy Miller, South Hamilton, MA (US); Vikram Singh, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 754 days.

(21) Appl. No.: 11/676,069

(22) Filed: Feb. 16, 2007

(65) Prior Publication Data
US 2008/0200015 A1    Aug. 21, 2008

(51) Int. Cl.
*H01L 21/26* (2006.01)
(52) U.S. Cl. ............................. 438/513; 257/E21.143
(58) Field of Classification Search ................. 438/513, 438/516; 257/E21.143
See application file for complete search history.

(56) References Cited

U.S. PATENT DOCUMENTS

| | | | |
|---|---|---|---|
| 4,828,369 A | 5/1989 | Hotomi | |
| 5,279,669 A | 1/1994 | Lee | |
| 5,330,800 A | 7/1994 | Schumacher et al. | |
| 5,449,920 A | 9/1995 | Chan | |
| 5,540,824 A | 7/1996 | Yin et al. | |
| 5,556,501 A | 9/1996 | Collins et al. | |
| 5,711,812 A | 1/1998 | Chapek et al. | |
| 5,911,832 A | 6/1999 | Denholm et al. | |
| 6,051,073 A | 4/2000 | Chu et al. | |
| 6,083,363 A | 7/2000 | Ashtiani et al. | |
| 6,087,615 A | 7/2000 | Schork et al. | |
| 6,113,735 A | 9/2000 | Chu et al. | |
| 6,162,323 A | 12/2000 | Koshimizu | |
| 6,269,765 B1 | 8/2001 | Chu et al. | |
| 6,359,310 B1 | 3/2002 | Gonzalez et al. | |
| 6,433,553 B1 | 8/2002 | Goeckner et al. | |
| 6,500,496 B1 | 12/2002 | Goeckner et al. | |
| 6,518,190 B1 | 2/2003 | Lill et al. | |
| 6,734,446 B1 | 5/2004 | Yamazaki et al. | |

(Continued)

FOREIGN PATENT DOCUMENTS

EP    0 810 816 A1    12/1997

(Continued)

OTHER PUBLICATIONS

Chu, Recent Developments and Applications of Plasma Immersion Ion Implantation, J. Vac. Sci. Technol. B., Jan./Feb. 2004, pp. 289-296, vol. 22, No. 1, American Vacuum Society, 2004.

(Continued)

*Primary Examiner*—Chandra Chaudhari (57) ABSTRACT

A method of multi-step plasma doping a substrate includes igniting a plasma from a process gas. A first plasma condition is established for performing a first plasma doping step. The substrate is biased so that ions in the plasma having the first plasma condition impact a surface of the substrate thereby exposing the substrate to a first dose. The first plasma condition transitions to a second plasma condition. The substrate is biased so that ions in the plasma having the second plasma condition impact the surface of the substrate thereby exposing the substrate to a second dose. The first and second plasma conditions are chosen so that the first and second doses combine to achieve a predetermined distribution of dose across at least a portion of the substrate.

23 Claims, 5 Drawing Sheets

U.S. PATENT DOCUMENTS

| | | | |
|---|---|---|---|
| 6,849,857 | B2 | 2/2005 | Ichiki et al. |
| 2001/0046566 | A1 | 11/2001 | Chu et al. |
| 2003/0079688 | A1 | 5/2003 | Walther et al. |
| 2003/0082891 | A1 | 5/2003 | Walther |
| 2003/0101935 | A1 | 6/2003 | Walther |
| 2003/0116090 | A1 | 6/2003 | Chu et al. |
| 2003/0201722 | A1 | 10/2003 | Appleyard |
| 2004/0016402 | A1 | 1/2004 | Walther et al. |
| 2004/0036038 | A1* | 2/2004 | Okumura et al. ............ 438/513 |
| 2005/0205212 | A1 | 9/2005 | Singh et al. |
| 2006/0236931 | A1 | 10/2006 | Singh et al. |
| 2007/0166846 | A1 | 7/2007 | Sasaki et al. |

FOREIGN PATENT DOCUMENTS

| | | | |
|---|---|---|---|
| EP | 1596427 | A | 11/2005 |
| WO | 2005076328 | A | 8/2005 |
| WO | 2006064772 | A | 6/2006 |

OTHER PUBLICATIONS

Cheung, Nathan W., Plasma Immersion Ion Implantation for ULSI Devices, p. 337, University of California, Berkeley, CA, USA., 1995.

Yu, Crid, et al., Trench Doping Conformality by Plasma Immersion Ion Implantation(PIII): IEEE, 1994, pp. 196-198, University of California, Berkeley, CA, USA.

Lee, et al, Plasma Immersion Ion Implantation As an Alternative Deep Trench Buried-Plate Doping Technology, IEEE, 2000, pp. 460-463.

Gupta, et al, Conformal Doping Apparatus and Method, U.S. Appl. No. 11/163,303, filed Oct. 13, 2005.

Gupta, et al., Conformal Doping Apparatus and Method, U.S. Appl. No. 11/163,307, filed Oct. 13, 2005.

Walther, Plasma Doping With Electronically Controllable Implant Angle, U.S. Appl. No. 11/566,418, filed Dec. 4, 2006.

Persing, Plasma Immersion Ion Source With Low Effective Antenna Voltage, U.S. Appl. No. 11/617,785, filed Dec. 29, 2006.

Hertel, et al., Plasma Source With Liner For Reducing Metal Contamination, U.S. Appl. No. 11/623,739, filed Jan. 16, 2007.

Sasaki Y, et al.: "$B_2H_6$ Plasma Doping with In-Situ He Pre-Amorphization;" VLSI Technology, 2004; Digest of Technical Papers, 2004 Symposium on Honolulu, HI: Jun. 15-17, 2004; Piscataway, NJ, IEEE, Jun. 15, 2004; pp. 180-181.

* cited by examiner

MULTI-STEP PLASMA DOPING WITH IMPROVED DOSE CONTROL

The section headings used herein are for organizational purposes only and should not to be construed as limiting the subject matter described in the present application.

BACKGROUND OF THE INVENTION

Plasma processing has been widely used in the semiconductor and other industries for many decades. Plasma processing is used for tasks such as cleaning, etching, milling, and deposition. More recently, plasma processing has been used for doping. Plasma doping systems have been developed to meet the doping requirements of some modern electronic and optical devices. Plasma doping is sometimes referred to as PLAD or plasma immersion ion implantation (PIII).

Plasma doing is fundamentally different from conventional beam-line ion implantation systems that accelerate ions with an electric field and then filter the ions according to their mass-to-charge ratio to select the desired ions for implantation. Plasma doping systems immerse the target in a plasma containing dopant ions and bias the target with a series of negative voltage pulses. The electric field within the plasma sheath accelerates ions toward the target which implants the ions into the target surface.

Ion implantation and other doping systems for the semiconductor industry generally require a very high degree of uniformity. Conventional beam-line ion implantation systems used in the semiconductor industry provide excellent uniformity across the entire surface of state-of-the art semiconductor substrates. In general, the uniformity of plasma doping systems is not as good as conventional beam-line ion implantation systems. Many plasma doping systems have at least some radial non-uniformities in dosing. The radial non-uniformity in dosing often results in higher doses toward the center of the substrate or higher doses near the edge of the substrate.

BRIEF DESCRIPTION OF THE DRAWINGS

The aspects of this invention may be better understood by referring to the following description in conjunction with the accompanied drawings, in which like numerals indicate like structural elements and features in various figures. The drawings are not necessarily to scale. A skilled artisan will understand that the drawings, described below, are for illustration purposes only. The drawings are not intended to limit the scope of the present teachings in any way.

DETAILED DESCRIPTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

For example, although the methods of improving uniformity of the present invention are described in connection with plasma doping, it should be understood that the methods of the present invention can be applied to any type of plasma process. Specifically, the methods of improving uniformity according to the present invention can be applied to plasma etching and plasma deposition systems.

It should be understood that the individual steps of the methods of the present invention may be performed in any order and/or simultaneously as long as the invention remains operable. Furthermore, it should be understood that the apparatus of the present invention can include any number or all of the described embodiments as long as the invention remains operable.

It is usually desirable to implant a uniform dose across the entire surface of a semiconductor substrate in order to obtain similar device performance for all devices and chips on a substrate. Plasma doping systems often have relatively high radial non-uniformities in dosing. The radial non-uniformities in the dosing occur because it is relatively difficult to produce a plasma with a highly uniform plasma density in chambers commonly used for plasma doping. The radial non-uniformity in dosing often results in higher doses toward the center of the substrate or higher doses near the edge of the substrate.

In many applications, it is desirable to improve the radial and other non-uniformities in dosing by reducing the overall non-uniformities in dosing over the surface of the substrate. In some applications it is desirable to control the radial and other non-uniformities in dosing to achieve a certain predetermined dosing distribution over the surface of the substrate.

The radial non-uniformity in the dosing can be controlled or improved somewhat by changing the geometry of the plasma chamber, plasma source, and the pedestal supporting the substrate. In addition, the radial non-uniformity in the dosing can be controlled or improved by changing process parameters such as pressure, gas flow, RF power, or dilution.

The methods of the present invention improve the uniformity of the dosing across a substrate or control the distribution of dosing across a substrate by using multi-step plasma doping. In some embodiments, the plasma doping is paused for a predetermined time interval between each of the multiple plasma doping steps. Each of the multiple plasma doping steps can have different process conditions. In various embodiments, the plasma can be active or extinguished during the transition time between each of the plasma doping steps.

Figure 1:
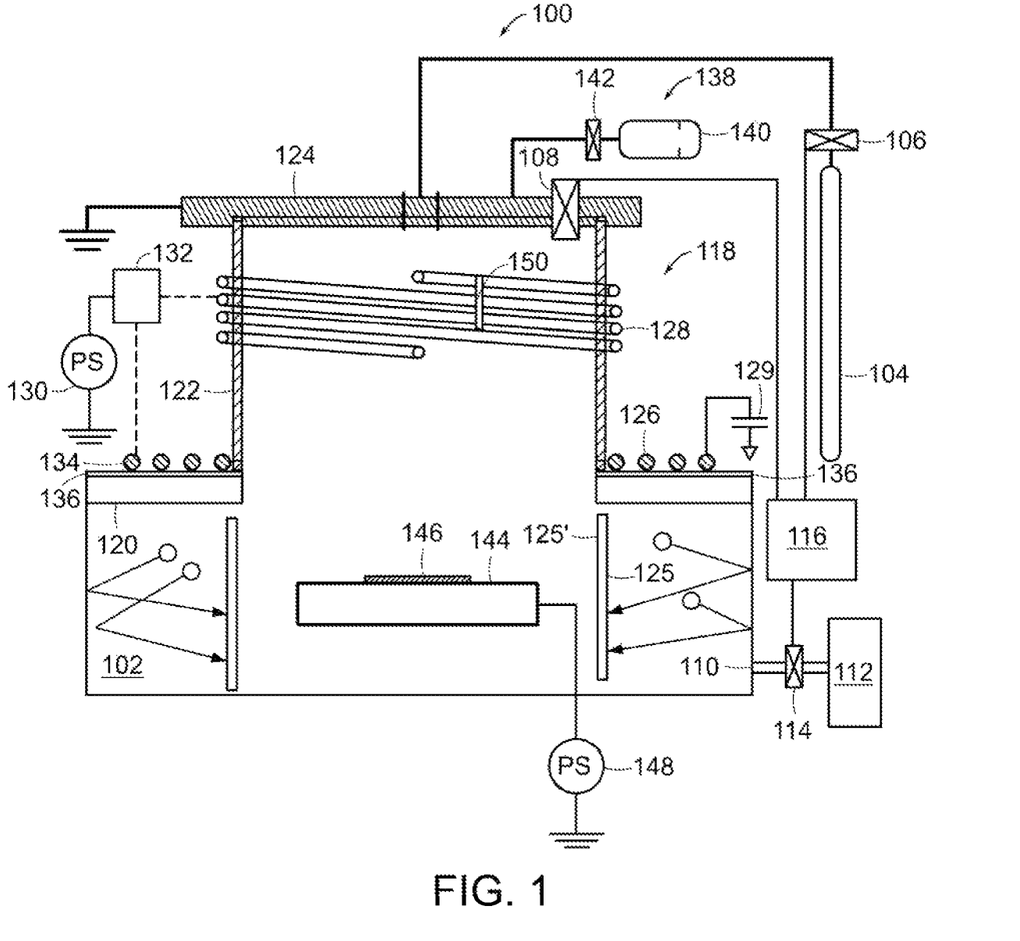
FIG. 1 illustrates a plasma doping system that can be used with the multi-step plasma doping method according to the present invention.

FIG. 1 illustrates a plasma doping system 100 that can be used with the multi-step plasma doping method according to the present invention. The plasma doping system 100 includes an inductively coupled plasma source having both a planar and a helical RF coil and a conductive top section. A similar RF inductively coupled plasma source is described in U.S. patent application Ser. No. 10/905,172, filed on Dec. 20, 2004, entitled "RF Plasma Source with Conductive Top Section," which is assigned to the present assignee. The entire specification of U.S. patent application Ser. No. 10/905,172 is incorporated herein by reference. The plasma source shown in the plasma doping system 100 is well suited for plasma doping applications because it can provide a highly uniform ion flux and the source also efficiently dissipates heat generated by secondary electron emissions.

More specifically, the plasma doping system 100 includes a plasma chamber 102 that contains a process gas supplied by an external gas source 104. The external gas source 104, which is coupled to the plasma chamber 102 through a proportional valve 106, supplies the process gas to the chamber 102. In some embodiments, a gas baffle is used to disperse the gas into the plasma source 102. A pressure gauge 108 measures the pressure inside the chamber 102. An exhaust port 110 in the chamber 102 is coupled to a vacuum pump 112 that evacuates the chamber 102. An exhaust valve 114 controls the exhaust conductance through the exhaust port 110.

A gas pressure controller 116 is electrically connected to the proportional valve 106, the pressure gauge 108, and the exhaust valve 114. The gas pressure controller 116 maintains the desired pressure in the plasma chamber 102 by controlling the exhaust conductance and the process gas flow rate in a feedback loop that is responsive to the pressure gauge 108. The exhaust conductance is controlled with the exhaust valve 114. The process gas flow rate is controlled with the proportional valve 106.

In some embodiments, a ratio control of trace gas species is provided to the process gas by a mass flow meter that is coupled in-line with the process gas that provides the primary dopant species. Also, in some embodiments, a separate gas injection means is used for in-situ conditioning species. Furthermore, in some embodiments, a multi-port gas injection means is used to provide gases that cause neutral chemistry effects that result in across substrate variations.

The chamber 102 has a chamber top 118 including a first section 120 formed of a dielectric material that extends in a generally horizontal direction. A second section 122 of the chamber top 118 is formed of a dielectric material that extends a height from the first section 120 in a generally vertical direction. The first and second sections 120, 122 are sometimes referred to herein generally as the dielectric window. It should be understood that there are numerous variations of the chamber top 118. For example, the first section 120 can be formed of a dielectric material that extends in a generally curved direction so that the first and second sections 120, 122 are not orthogonal as described in U.S. patent application Ser. No. 10/905,172, which is incorporated herein by reference. In other embodiment, the chamber top 118 includes only a planer surface.

The shape and dimensions of the first and the second sections 120, 122 can be selected to achieve a certain performance. For example, one skilled in the art will understand that the dimensions of the first and the second sections 120, 122 of the chamber top 118 can be chosen to improve the uniformity of plasmas. In one embodiment, a ratio of the height of the second section 122 in the vertical direction to the length across the second section 122 in the horizontal direction is adjusted to achieve a more uniform plasma. For example, in one particular embodiment, the ratio of the height of the second section 122 in the vertical direction to the length across the second section 122 in the horizontal direction is in the range of 1.5 to 5.5.

The dielectric materials in the first and second sections 120, 122 provide a medium for transferring the RF power from the RF antenna to a plasma inside the chamber 102. In one embodiment, the dielectric material used to form the first and second sections 120, 122 is a high purity ceramic material that is chemically resistant to the process gases and that has good thermal properties. For example, in some embodiments, the dielectric material is 99.6% $Al_2O_3$ or AlN. In other embodiments, the dielectric material is Yittria and YAG.

A lid 124 of the chamber top 118 is formed of a conductive material that extends a length across the second section 122 in the horizontal direction. In many embodiments, the conductivity of the material used to form the lid 124 is high enough to dissipate the heat load and to minimize charging effects that results from secondary electron emission. Typically, the conductive material used to form the lid 124 is chemically resistant to the process gases. In some embodiments, the conductive material is aluminum or silicon.

The lid 124 can be coupled to the second section 122 with a halogen resistant O-ring made of fluoro-carbon polymer, such as an O-ring formed of Chemrz and/or Kalrex materials. The lid 124 is typically mounted to the second section 122 in a manner that minimizes compression on the second section 122, but that provides enough compression to seal the lid 124 to the second section. In some operating modes, the lid 124 is RF and DC grounded as shown in FIG. 1.

In some embodiments, the chamber 102 includes a liner 125 that is positioned to prevent or greatly reduce metal contamination by providing line-of-site shielding of the inside of the plasma chamber 102 from metal sputtered by ions in the plasma striking the inside metal walls of the plasma chamber 102. Such liners are described in U.S. patent application Ser. No. 11/623,739, filed Jan. 16, 2007, entitled "Plasma Source with Liner for Reducing Metal Contamination," which is assigned to the present assignee. The entire specification of U.S. patent application Ser. No. 11/623,739 is incorporated herein by reference.

In various embodiments, the liner can be a one-piece or unitary plasma chamber liner, or a segmented plasma chamber liner. In many embodiments, the plasma chamber liner 125 is formed of a metal base material, such as aluminum. In these embodiments, at least the inner surface 125' of the plasma chamber liner 125 includes a hard coating material that prevents sputtering of the plasma chamber liner base material.

Some plasma doping processes generate a considerable amount of non-uniformly distributed heat on the inner surfaces of the plasma source because of secondary electron emissions. In some embodiments, the plasma chamber liner 125 is a temperature controlled plasma chamber liner 125 as described in connection with FIG. 4. In addition, in some embodiments, the lid 124 comprises a cooling system that regulates the temperature of the lid 124 and surrounding area in order to dissipate the heat load generated during processing. The cooling system can be a fluid cooling system that includes cooling passages in the lid 124 that circulate a liquid coolant from a coolant source.

A RF antenna is positioned proximate to at least one of the first section 120 and the second section 122 of the chamber top 118. The plasma source in FIG. 1 illustrates two separate RF antennas that are electrically isolated from one another. However, in other embodiments, the two separate RF antennas are electrically connected. In the embodiment shown in FIG. 1, a planar coil RF antenna 126 (sometimes called a planar antenna or a horizontal antenna) having a plurality of turns is positioned adjacent to the first section 120 of the chamber top 118. In addition, a helical coil RF antenna 128 (sometimes called a helical antenna or a vertical antenna) having a plurality of turns surrounds the second section 122 of the chamber top 118.

In some embodiments, at least one of the planar coil RF antenna 126 and the helical coil RF antenna 128 is terminated with a capacitor 129 that reduces the effective antenna coil voltage. The term "effective antenna coil voltage" is defined herein to mean the voltage drop across the RF antennas 126, 128. In other words, the effective coil voltage is the voltage "seen by the ions" or equivalently the voltage experienced by the ions in the plasma.

Also, in some embodiments, at least one of the planar coil RF antenna 126 and the helical coil RF antenna 128 includes a dielectric layer 134 that has a relatively low dielectric constant compared to the dielectric constant of the $Al_2O_3$ dielectric window material. The relatively low dielectric constant dielectric layer 134 effectively forms a capacitive voltage divider that also reduces the effective antenna coil voltage. In addition, in some embodiments, at least one of the planar coil RF antenna 126 and the helical coil RF antenna 128 includes a Faraday shield 136 that also reduces the effective antenna coil voltage.

A RF source 130, such as a RF power supply, is electrically connected to at least one of the planar coil RF antenna 126 and helical coil RF antenna 128. In many embodiments, the RF source 130 is coupled to the RF antennas 126, 128 by an impedance matching network 132 that matches the output impedance of the RF source 130 to the impedance of the RF antennas 126, 128 in order to maximize the power transferred from the RF source 130 to the RF antennas 126, 128. Dashed lines from the output of the impedance matching network 132 to the planar coil RF antenna 126 and the helical coil RF antenna 128 are shown to indicate that electrical connections can be made from the output of the impedance matching network 132 to either or both of the planar coil RF antenna 126 and the helical coil RF antenna 128.

In some embodiments, at least one of the planar coil RF antenna 126 and the helical coil RF antenna 128 is formed such that it can be liquid cooled. Cooling at least one of the planar coil RF antenna 126 and the helical coil RF antenna 128 will reduce temperature gradients caused by the RF power propagating in the RF antennas 126, 128.

In some embodiments, the plasma source includes a plasma igniter 138. Numerous types of plasma igniters can be used with the plasma source apparatus of the present invention. In one embodiment, the plasma igniter 138 includes a reservoir 140 of strike gas, which is a highly-ionizable gas, such as argon (Ar), which assists in igniting the plasma. The reservoir 140 is coupled to the plasma chamber 102 with a high conductance gas connection. A burst valve 142 isolates the reservoir 140 from the process chamber 102. In another embodiment, a strike gas source is plumbed directly to the burst valve 142 using a low conductance gas connection. In some embodiments, a portion of the reservoir 140 is separated by a limited conductance orifice or metering valve that provides a steady flow rate of strike gas after the initial high-flow-rate burst.

A platen 144 is positioned in the process chamber 102 a height below the top section 118 of the plasma source 102. The platen 144 holds a substrate 146 for plasma doping. In many embodiments, the substrate 146 is electrically connected to the platen 144. In the embodiment shown in FIG. 1, the platen 144 is parallel to the plasma source 102. However, in one embodiment of the present invention, the platen 144 is tilted with respect to the plasma source 102.

A platen 144 is used to support a substrate 146 or other workpieces for processing. In some embodiments, the platen 144 is mechanically coupled to a movable stage that translates, scans, or oscillates the substrate 146 in at least one direction. In one embodiment, the movable stage is a dither generator or an oscillator that dithers or oscillates the substrate 146. The translation, dithering, and/or oscillation motions can reduce or eliminate shadowing effects and can improve the uniformity of the ion beam flux impacting the surface of the substrate 146.

A bias voltage power supply 148 is electrically connected to the platen 144. The bias voltage power supply 148 is used to bias the platen 144 and the substrate 146 so that dopant ions in the plasma are extracted from the plasma and impact the substrate 146. The bias voltage power supply 148 can be a DC power supply, a pulsed power supply, or a RF power supply. In some embodiments, a grid is used to extract ions in the plasma towards the substrate 146. One skilled in the art will appreciate that the plasma doping apparatus of FIG. 1 has many different possible biasing configurations.

One skilled in the art will appreciate that the there are many different possible variations of the plasma source that can be used with the features of the present invention. See for example, the descriptions of the plasma sources in U.S. patent application Ser. No. 10/908,009, filed Apr. 25, 2005, entitled "Tilted Plasma Doping." Also see the descriptions of the plasma sources in U.S. patent application Ser. No. 11/163,303, filed Oct. 13, 2005, entitled "Conformal Doping Apparatus and Method." Also see the descriptions of the plasma sources in U.S. patent application Ser. No. 11/163,307, filed Oct. 13, 2005, entitled "Conformal Doping Apparatus and Method." In addition, see the descriptions of the plasma sources in U.S. patent application Ser. No. 11/566,418, filed Dec. 4, 2006, entitled "Plasma Doping with Electronically Controllable implant Angle." The entire specification of U.S. patent application Ser. Nos. 10/908,009, 11/163,303, 11/163, 307 and 11/566,418 are herein incorporated by reference.

Figure 2:
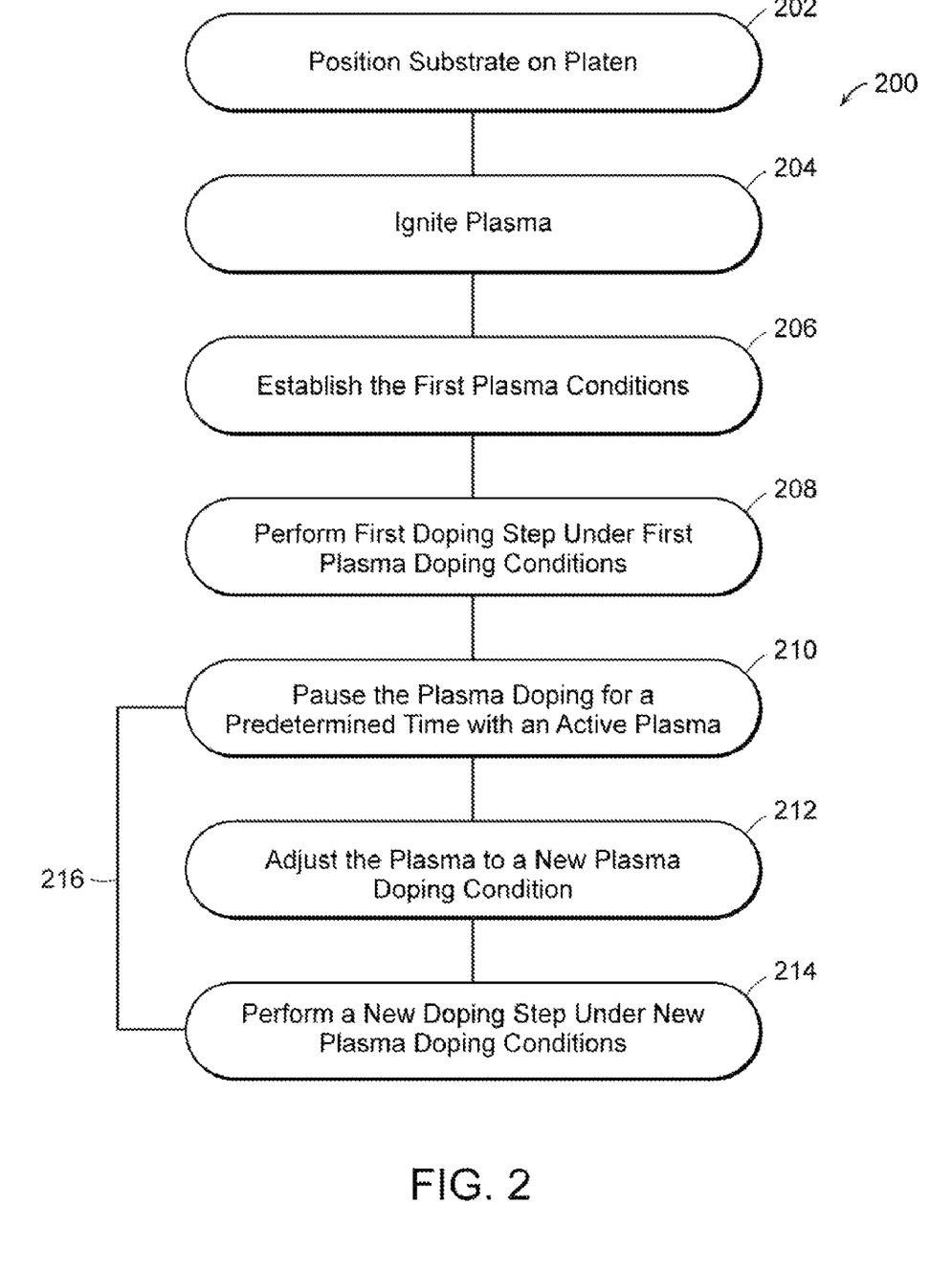
FIG. 2 is a flow chart of a multi-step method of plasma doping that maintains the plasma while transitioning between steps according to the present invention.

FIG. 2 is a flow chart of a multi-step method 200 of plasma doping that maintains the plasma while transitioning between steps according to the present invention. Referring to both FIGS. 1 and 2, in a first step 202 of the method 200, the substrate 146 is positioned on the platen 144. In a second step 204, a plasma is ignited in the plasma doping system 100. In some embodiments, the plasma is ignited with the desired process parameters of the first doping step. In other embodiments, the second step 204 of igniting the plasma is performed under other condition, such as conditions chosen for rapid plasma ignition.

In one embodiment, the plasma is ignited when the RF source 130 generates RF currents that propagate in at least one of the RF antennas 126 and 128. That is, the plasma is ignited when at least one of the planar coil RF antenna 126 and the helical coil RF antenna 128 is an active antenna. The term "active antenna" is herein defined as an antenna that is driven directly by a power supply. The RF currents in the RF antennas 126, 128 then induce RF currents into the chamber 102. The RF currents in the chamber 102 excite and ionize the process gas so as to generate a plasma in the chamber 102. The plasma sources can operate in either a continuous mode or a pulsed mode.

In some embodiments, one of the planar coil antenna 126 and the helical coil antenna 128 is a parasitic antenna. The term "parasitic antenna" is defined herein to mean an antenna that is in electromagnetic communication with an active antenna, but that is not directly connected to a power supply. In other words, a parasitic antenna is not directly excited by a power supply, but rather is excited by an active antenna. In some embodiments of the invention, one end of the parasitic antenna is electrically connected to ground potential in order to provide antenna tuning capabilities. In this embodiment, the parasitic antenna includes a coil adjuster 150 that is used to change the effective number of turns in the parasitic antenna coil. Numerous different types of coil adjusters, such as a metal short, can be used.

The third step 206 includes establishing the first plasma conditions. In the third step 206, the flow rate of the process gases is adjusted to the desired flow rate and the position of the exhaust valve 114 that controls the exhaust conductance through the exhaust port 110 is adjusted in order to regulate the pressure in the chamber 102 to the desired pressure. The third step 206 also includes adjusting the power generated by the RF source 130 to adjust the power of the plasma.

The fourth step 208 includes performing the first doping step under the first plasma doping conditions. The fourth step 208 includes biasing the platen 144 and the substrate 146 with the voltage power supply 148 under the first plasma doping conditions so that dopant ions in the plasma are extracted from the plasma and impact the substrate 146. The first doping step exposes the substrate 148 to a first partial dose of dopant ions.

The fifth step 210 includes pausing the plasma doping for a predetermined time. This step includes reducing or terminating the output voltage of the voltage power supply 148 so that dopant ions do not impact the substrate 146. In the multi-step method of plasma doping described in connection with FIG. 2, the plasma remains active during the pause. In some embodiments, the plasma process gas or process gas flow rate is changed during the pause. In other methods of plasma doping according to the present invention, the plasma is extinguished during the pause as described in connection with FIG. 3.

The sixth step 212 includes adjusting the plasma to a new (the second) plasma doping conditions. In the sixth step 212, the flow rate of the process gases is adjusted to the new desired flow rate and the position of the exhaust valve 114 that controls the exhaust conductance through the exhaust port 110 is adjusted in order to regulate the pressure in the chamber 102 to the new desired pressure. The sixth step 212 also includes adjusting the power generated by the RF source 130 to change the power of the plasma to the new power.

The seventh step 214 includes performing a new (the second) doping step under new plasma doping conditions. In the seventh step 216, the platen 144 and the substrate 146 is biased with the voltage power supply 148 under the new plasma doping conditions so that dopant ions in the plasma are extracted from the plasma and impact the substrate 146. The new plasma doping step exposes the substrate 148 to a new partial dose of dopant ions.

The eighth step 216 includes repeating the steps of pausing the plasma doping for a predetermined time, adjusting the plasma to a new plasma doping condition, and performing a new plasma doping step under the new doping conditions. In various embodiments, the eighth step 216 is repeated any number of times to obtain the desired dose in the substrate 146.

Figure 3:
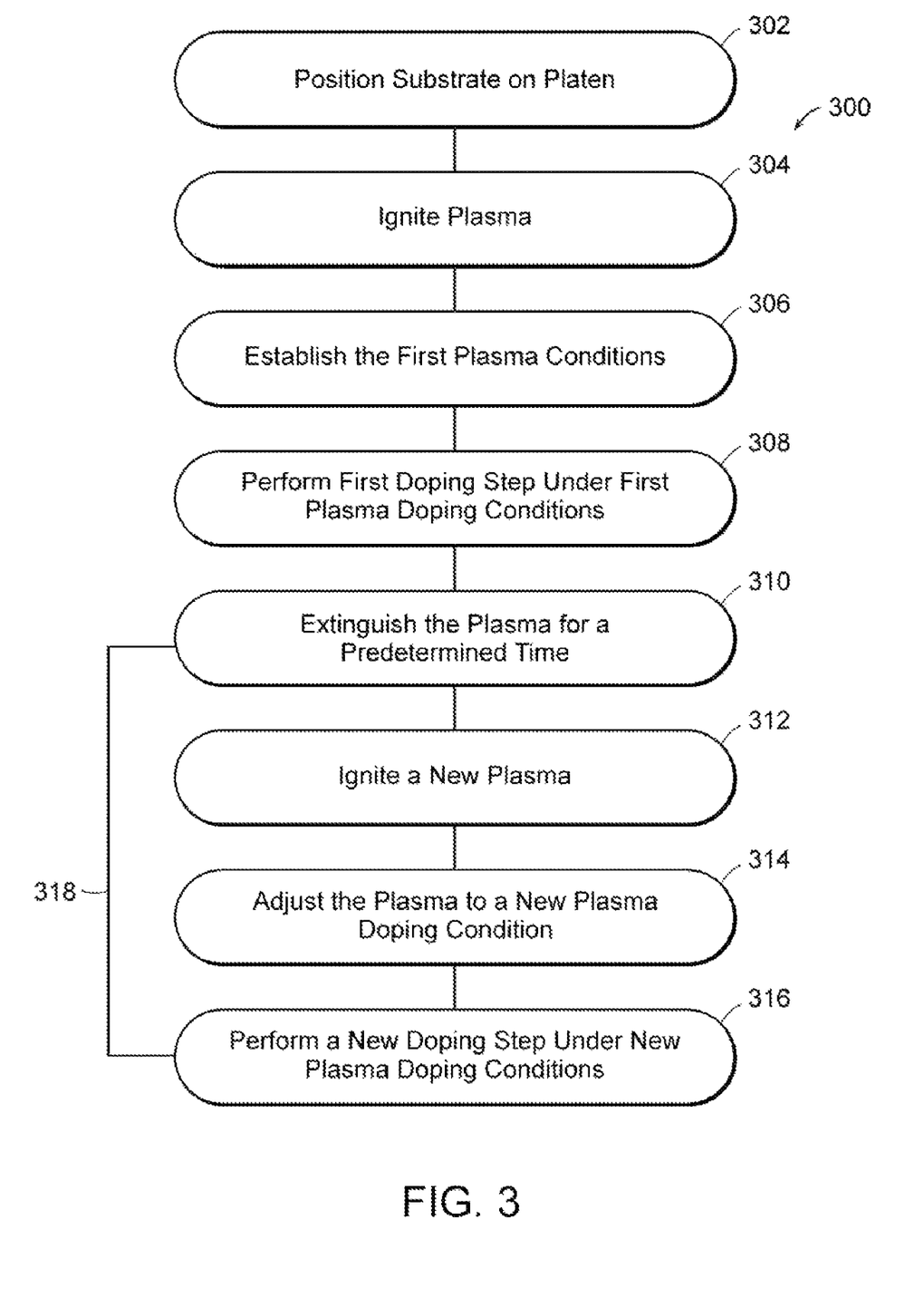
FIG. 3 is a flow chart of a multi-step method of plasma doping that extinguishes the plasma while transitioning between steps according to the present invention.

FIG. 3 is a flow chart of a multi-step method 300 of plasma doping that extinguishes the plasma while transitioning between steps according to the present invention. Referring to both FIGS. 1 and 2, in a first step 302 the substrate 146 is positioned on the platen 144. In a second step 304, a plasma is ignited in the plasma doping system 100. In some embodiments, the plasma is ignited with the desired process parameters of the first doping step. In other embodiments, the second step 302 of igniting the plasma is performed under other condition, such as conditions chosen for rapid plasma ignition. In one embodiment, the plasma is ignited with the RF source 130 as described in connection with the method 200 of FIG. 2.

The third step 306 includes adjusting the plasma to the first plasma doping conditions. In the third step 306, the flow rate of the process gases is adjusted to the desired flow rate and the position of the exhaust valve 114 that controls the exhaust conductance through the exhaust port 110 is adjusted in order to regulate the pressure in the chamber 102 to the desired pressure. The third step 306 also includes adjusting the power generated by the RF source 130 to adjust the power of the plasma.

The fourth step 308 includes performing the first doping step under the first plasma doping conditions. The fourth step 308 includes biasing the platen 144 and the substrate 146 with the voltage power supply 148 under the first plasma doping conditions so that dopant ions in the plasma are extracted from the plasma and impact the substrate 146. The first doping step exposes the substrate 148 to a first partial dose of dopant ions.

The fifth step 310 includes extinguishing the plasma for a predetermined time thereby pausing the plasma doping for the predetermined time. The fifth step 310 includes deactivating the RF source 130 so that RF currents no longer propagate in the RF antennas 126 and 128, thereby extinguishing the plasma. In some embodiments, the output voltage of the voltage power supply 148 is also deactivated so as to precisely control when dopant ions stop impact the substrate 146.

The sixth step 312 includes igniting a new (the second) plasma in the plasma doping system 100. In some embodiments, the new plasma is ignited with the desired process parameters of the new (the second) doping step. In other embodiments, the igniting the new plasma is performed under other condition, such as conditions chosen for rapid plasma ignition. In one embodiment, the new plasma is ignited with the RF source 130 as described in connection with the method 200 of FIG. 2.

The seventh step 314 includes adjusting the plasma to a new (the second) plasma doping conditions. The seventh step 314 includes adjusting the flow rate of the process gases to the new desired flow rate and adjusting the position of the exhaust valve 114 that controls the exhaust conductance through the exhaust port 110 in order to regulate the pressure in the chamber 102 to the new desired pressure. The seventh step 314 also includes adjusting the power generated by the RF source 130 to adjust the power of the plasma to the new power.

The eighth step 316 includes performing a new (the second) doping step under new plasma doping conditions. The eighth step 316 includes biasing the platen 144 and the substrate 146 with the voltage power supply 148 under the new plasma doping conditions so that dopant ions in the plasma are extracted from the plasma and impact the substrate 146. The new doping step exposes the substrate 148 to a new partial dose of dopant ions.

The ninth step 318 includes repeating the steps of extinguishing the plasma for a predetermined time, igniting the new plasma, adjusting the plasma to a new plasma doping conditions, and performing the new doping step under the new doping conditions. In various embodiments, the ninth step 318 is repeated any number of times to obtain the desired dose in the substrate 146.

Figure 4:
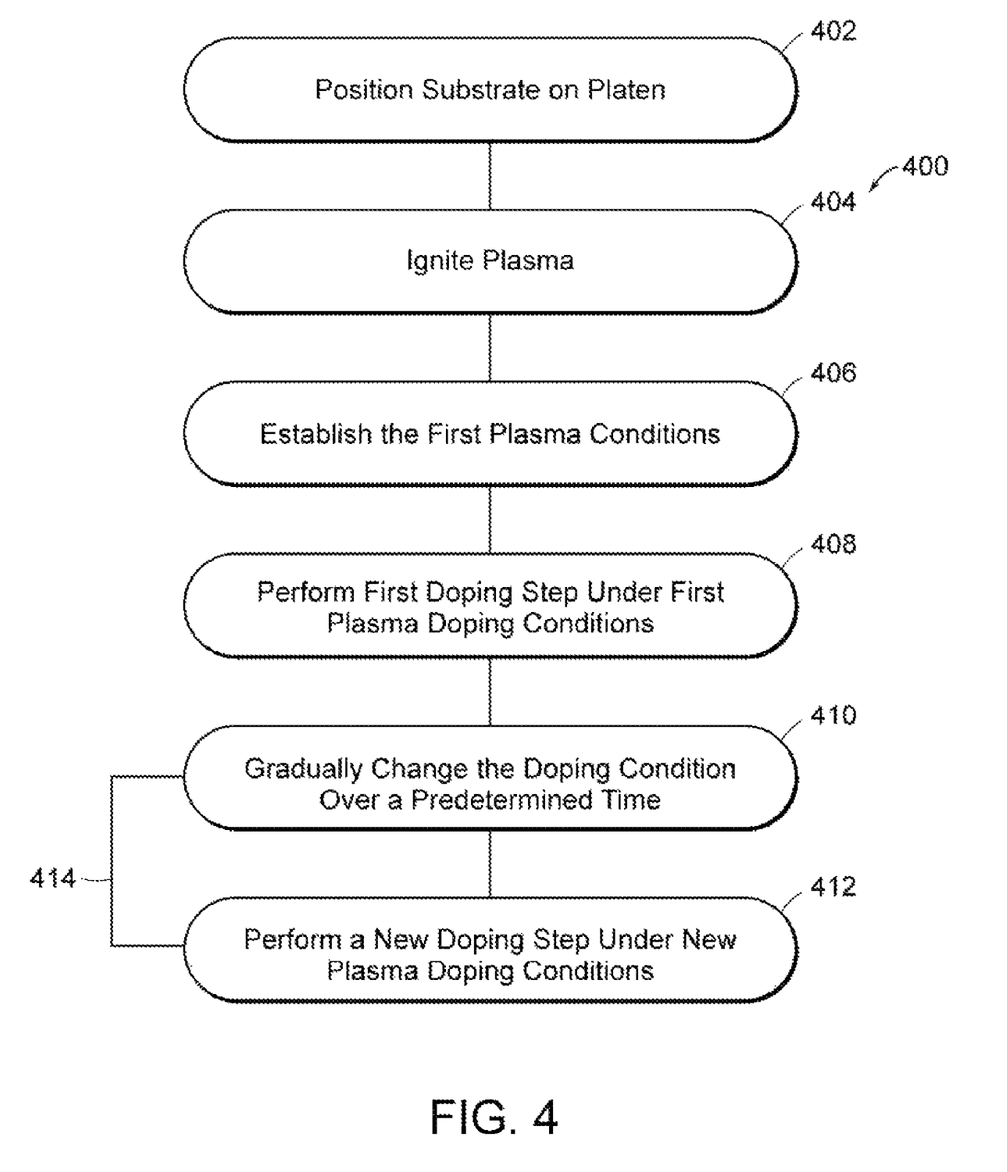
FIG. 4 is a flow chart of a multi-step method of plasma doping that gradually changes the plasma conditions while transitioning between steps according to the present invention.

FIG. 4 is a flow chart of a multi-step method 400 of plasma doping that gradually changes the plasma conditions while transitioning between steps according to the present invention. Referring to both FIGS. 1 and 2, in a first step 402 the substrate 146 is positioned on the platen 144. In a second step 404 a plasma is ignited in the plasma doping system 100. In some embodiments, the plasma is ignited with the desired process parameters of the first doping step. In other embodiments, the second step 404 of igniting the plasma is performed under other condition, such as conditions chosen for rapid plasma ignition. In one embodiment, the plasma is ignited with the RF source 130 as described in connection with the method 200 of FIG. 2.

The third step 406 includes adjusting the plasma to the first plasma doping conditions. In the third step 406, the position of the exhaust valve 114 that controls the exhaust conductance through the exhaust port 110 is adjusted in order to regulate the pressure in the chamber 102 to the desired pressure and the flow rate of the process gases is adjusted to the desired flow rate. The third step 406 also includes adjusting the power generated by the RF source 130 to adjust the power of the plasma.

The fourth step 408 includes performing the first doping step under the first plasma doping conditions. This step includes biasing the platen 144 and the substrate 146 with the voltage power supply 148 under the first plasma doping conditions so that dopant ions in the plasma are extracted from the plasma and impact the substrate 146. The first doping step exposes the substrate 148 to a first partial dose of dopant ions.

The fifth step 410 includes gradually changing the doping conditions over a predetermined time to new doping conditions. The fifth step 410 includes gradually changing at least one of plasma conditions and substrate bias conditions from the initial doping conditions to the new doping conditions. The plasma conditions include many factors, such as chamber pressure, process gas flow rate, and plasma power. The chamber pressure can be changed by adjusting the position of the exhaust valve 114 that controls the exhaust conductance through the exhaust port 110. The dopant flow rate can be changed by adjusting a mass flow controller that meters the flow of process gas into the chamber 102.

The bias conditions include the bias voltage on the substrate 148 and the bias voltage on any grids or electrodes that are in electromagnetic communications with the substrate 148. The bias conditions can be changed by adjusting the output voltage of the voltage power supply 148 to the desired bias voltage. In some embodiments, the bias voltage on the substrate 148 and the bias voltage on any grids or electrodes in electromagnetic communications with the substrate are terminated while the plasma conditions are gradually changed.

The sixth step 412 includes performing a new (the second) doping step under new plasma doping conditions that were established with the fifth step 410 that gradually changed the doping conditions over the predetermined time to the new doping conditions. In some embodiments, the new doping step can be initiated during the fifth step 410 where the doping conditions are gradually changing over the predetermined time to new doping conditions. In other embodiments, the new doping step is performed only after the new doping conditions are established.

The seventh step 414 includes repeating the steps of gradually changing the doping conditions over a predetermined time to new doping conditions, and performing the new doping step under the new doping conditions. In various embodiments, the seventh step 414 is repeated any number of times to obtain the desired dose in the substrate 146.

Figure 5A:
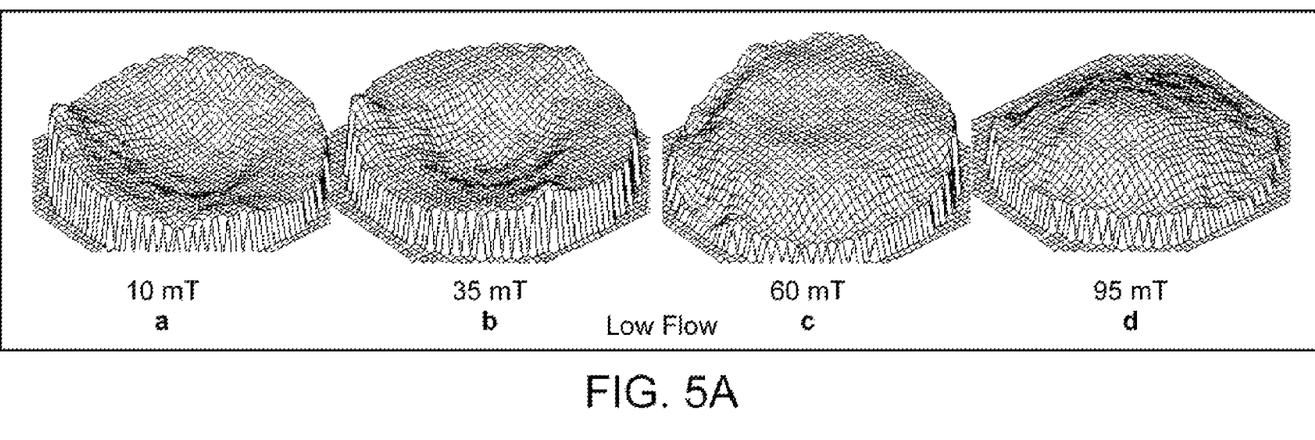
FIG. 5A illustrates a simulation of sheet resistivity (Rs) for relatively low process gas flow rates and chamber pressures that are in the range of 10 mT to 95 mT.
Figure 5B:
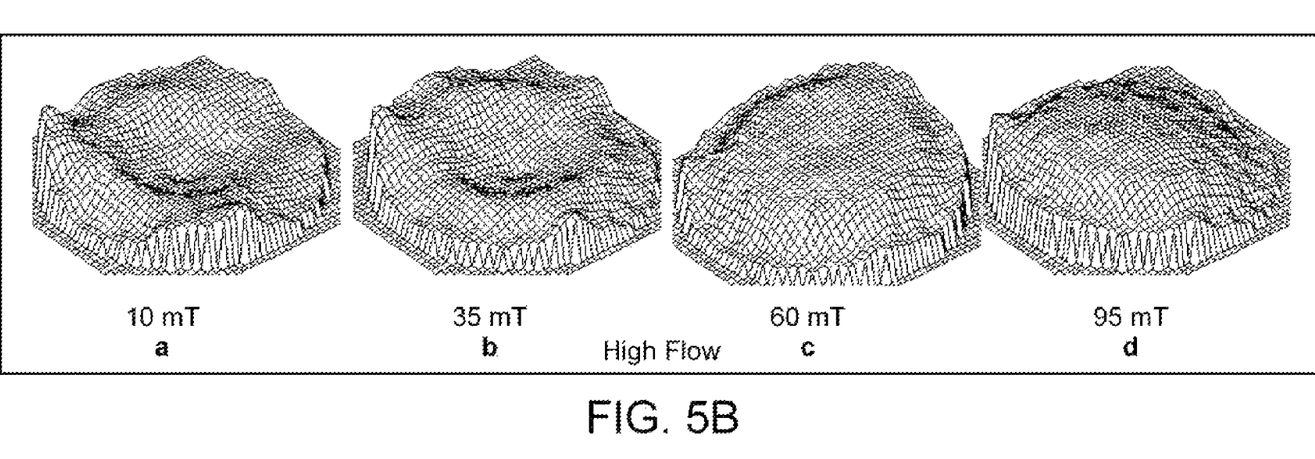
FIG. 5B illustrates a simulation of sheet resistivity (Rs) for relatively high process gas flow rates and chamber pressures that are in the range of 10 mT to 95 mT.

FIG. 5A illustrates a simulation 500 of sheet resistivity (Rs) for relatively low process gas flow rates and chamber pressures that are in the range of 10 mT to 95 mT. FIG. 5B illustrates a simulation 502 of sheet resistivity (Rs) for relatively high process gas flow rates and chamber pressures that are in the range of 10 mT to 95 mT. The darker gray scale indicates a lower sheet resistivity (Rs), which corresponds to a higher dose. The lighter gray scale indicates higher sheet resistivity (Rs), which corresponds to a lower dose.

The simulations shown in FIGS. 5A and 5B indicate that uniform dosing profiles can be obtained by performing a multi-step doping method with at least two different doping conditions as described in connection with FIGS. 2-4. For example, a simple two-step plasma doping process can be performed with a first step being performed at a relatively low process gas flow rate and a 10 mT chamber pressure to expose the substrate 146 to the first half of the dose and a second step being performed at a relatively high process gas flow rate and a 95 mT chamber pressure to expose the substrate 146 to the second half the dose.

One skilled in the art will understand that similar simulations can be performed for other plasma doping process variable, such as dilution rate, plasma density, plasma power, and substrate and/or grid bias voltage. In addition, one skilled in the art will understand that relatively simple experiments can be preformed to determine plasma doping process variables for the multi-step plasma doping.

There are an almost unlimited number of combinations of plasma doping parameters that can be changed to achieve the desired uniformity or the desired dose distribution across the surface of the wafer 146. In many embodiments, a relatively few number of steps is required to achieve the desired uniformity or the desired dose distribution across the surface of the wafer 146. However, any number of plasma doping steps can be performed.

Equivalents

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention as defined by the appended claims.

What is claimed is:

1. A method of multi-step plasma doping a substrate, the method comprising:
   igniting a plasma from a process gas;
   establishing a first plasma condition for performing a first plasma doping step;
   biasing the substrate so that ions in the plasma having the first plasma condition impact a surface of the substrate thereby doping the substrate to a first dose;
   transitioning from the first plasma condition to a second plasma condition for performing a second plasma doping step; and
   biasing the substrate so that ions in the plasma having the second plasma condition impact the surface of the substrate thereby doping the substrate to a second dose, the first and second plasma conditions being chosen so that the first and second doses combine to achieve a predetermined distribution of dose across at least a portion of the substrate.

2. The method of claim 1 wherein the predetermined distribution of dose comprises a relatively uniform distribution of dose across at least a portion of the substrate.

3. The method of claim 1 wherein the predetermined distribution of dose comprises a non-uniform distribution of dose across at least a portion of the substrate.

4. The method of claim 1 wherein the first plasma condition and the second plasma condition are different plasma conditions.

5. The method of claim 1 wherein the transitioning from the first plasma condition to the second plasma condition comprises maintaining an active plasma.

6. The method of claim 1 wherein the transitioning from the first plasma condition to the second plasma condition comprises extinguishing the substrate bias.

7. The method of claim 1 wherein the transitioning from the first plasma condition to the second plasma condition comprises gradually changing the first plasma condition to the second plasma condition while the plasma is active.

8. The method of claim 1 wherein the first and second plasma conditions comprise process gas flow rate.

9. The method of claim 1 wherein the first and second plasma conditions comprise chamber pressure.

10. The method of claim 1 wherein the first and second plasma conditions comprise plasma power.

11. The method of claim 1 further comprising:
   transitioning from the second plasma condition to a third plasma condition for performing a third plasma doping step; and
   biasing the substrate so that ions in the plasma having the third plasma condition impact the surface of the substrate thereby doping the substrate to a third dose, the first, second, and third plasma conditions being chosen to achieve the predetermined distribution of dosing across at least a portion of the substrate.

12. A method of multi-step plasma doping a substrate, the method comprising:
   igniting a first plasma from a process gas;
   establishing a first plasma condition for performing a first plasma doping step;
   biasing the substrate so that ions in the plasma having the first plasma condition impact a surface of the substrate thereby doping the substrate to a first dose;
   extinguishing the first plasma;
   igniting a second plasma from a process gas after the first plasma is extinguished;
   establishing a second plasma condition for performing a second plasma doping step; and
   biasing the substrate so that ions in the plasma having the second plasma condition impact the surface of the substrate doping the substrate to a second dose, the first and second plasma conditions being chosen so that the first and second doses combine to achieve a predetermined distribution of dose across at least a portion of the substrate.

13. The method of claim 12 wherein the predetermined distribution of dose comprises a relatively uniform distribution of dose across at least a portion of the substrate.

14. The method of claim 12 wherein the predetermined distribution of dose comprises a non-uniform distribution of dose across at least a portion of the substrate.

15. The method of claim 12 wherein the first plasma condition and the second plasma condition are different.

16. The method of claim 12 wherein the first and second plasma conditions comprise process gas flow rate.

17. The method of claim 12 wherein the first and second plasma conditions comprise process chamber pressure.

18. The method of claim 12 wherein the first and second plasma conditions comprise plasma power.

19. A method of multi-step plasma doping a substrate, the method comprising:
   igniting a plasma from a process gas;
   establishing a first plasma condition for performing a first plasma doping step;
   biasing the substrate so that ions in the plasma having the first plasma condition impact a surface of the substrate doping the substrate to a first dose;
   pausing the doping the substrate to the first dose;
   establishing a second plasma condition for performing a second plasma doping step; and
   biasing the substrate so that ions in the plasma having the second plasma condition impact the surface of the substrate thereby doping the substrate to a second dose, the first and second plasma condition being selected so that the first and the second doses combine to form a relatively uniform dose over at least a portion of the substrate.

20. The method of claim 19 wherein the first plasma condition and the second plasma condition are different.

21. The method of claim 19 wherein the first and second plasma conditions comprise process gas flow rate.

22. The method of claim 19 wherein the first and second plasma conditions comprise chamber pressure.

23. The method of claim 19 wherein the first and second plasma conditions comprise plasma power.

* * * * *